US008624483B2

(12) United States Patent
Knapp et al.

(10) Patent No.: US 8,624,483 B2
(45) Date of Patent: Jan. 7, 2014

(54) FIXTURE AND SOCKET ASSEMBLY FOR REPLACEABLE AND FLEXIBLE PANEL LIGHTING DEVICE

(75) Inventors: Thomas Alexander Knapp, Cleveland, OH (US); Deeder Aurongzeb, Mayfield Heights, OH (US)

(73) Assignee: General Electric Company, Schenectady, NY (US)

( * ) Notice: Subject to any disclaimer, the term of this patent is extended or adjusted under 35 U.S.C. 154(b) by 343 days.

(21) Appl. No.: 13/086,061

(22) Filed: Apr. 13, 2011

(65) Prior Publication Data

US 2012/0262929 A1    Oct. 18, 2012

(51) Int. Cl.
*H01L 51/50* (2006.01)

(52) U.S. Cl.
USPC ............................ 313/504; 362/382; 313/512

(58) Field of Classification Search
USPC ................... 313/504, 512; 362/382
See application file for complete search history.

(56) References Cited

U.S. PATENT DOCUMENTS

| 6,565,231 | B1 * | 5/2003 | Cok | 362/653 |
| 6,787,990 | B2 * | 9/2004 | Cok | 313/504 |
| 6,787,994 | B2 * | 9/2004 | Cok | 313/512 |
| 7,075,226 | B2 * | 7/2006 | Cok | 313/504 |
| D623,795 | S | 9/2010 | Ngai et al. | |
| 2003/0222578 | A1 * | 12/2003 | Cok | 313/512 |
| 2006/0107571 | A1 * | 5/2006 | Steer | 40/606.12 |
| 2012/0194970 | A1 | 8/2012 | Verjans et al. | |

FOREIGN PATENT DOCUMENTS

| EP | 1367676 A1 | 12/2003 |
| JP | 2005108516 A | 4/2005 |
| JP | 2006331854 A | 12/2006 |
| WO | 2008074431 A1 | 6/2008 |
| WO | 2010128440 A1 | 11/2010 |
| WO | 2011126665 A2 | 10/2011 |

OTHER PUBLICATIONS

PCT Search Report and Written Opinion dated Sep. 20, 2012 from corresponding Application No. PCTUS2012/032678.

* cited by examiner

*Primary Examiner* — Mary Ellen Bowman
(74) *Attorney, Agent, or Firm* — Fay Sharpe LLP

(57) ABSTRACT

A fixture and socket assembly is provided for replaceable and flexible panel lighting device. Preferably, perimeter edges of the flexible light source devices which may be arranged into a matrix or panel are mechanically and electrically connected to socket contacts provided at desired locations on the first surface of the fixture, which makes mechanical and electrical engagement with associated conductive portions or surface contacts on rear surfaces of the flexible light source devices.

20 Claims, 18 Drawing Sheets

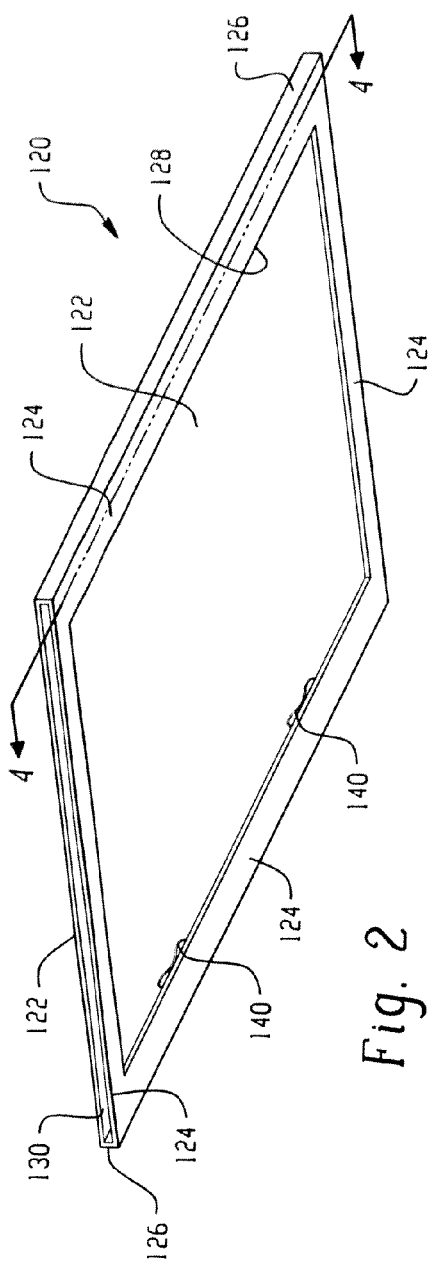
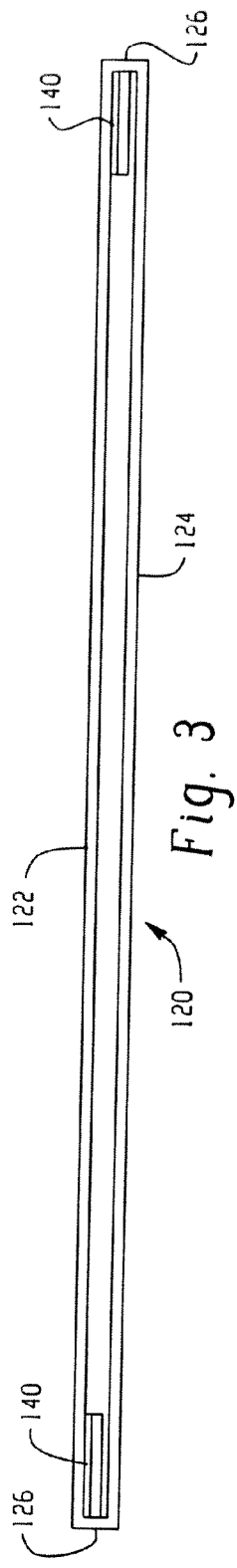
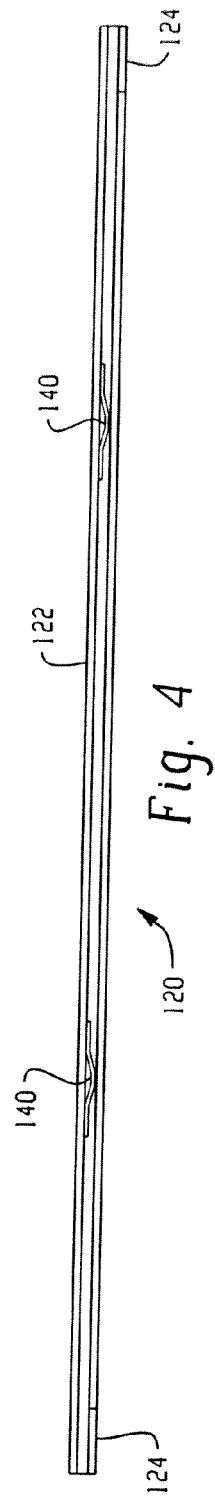
Fig. 2
Fig. 3
Fig. 4

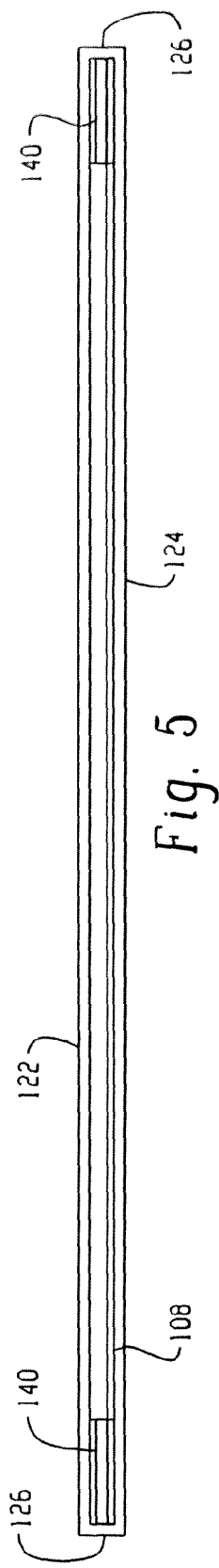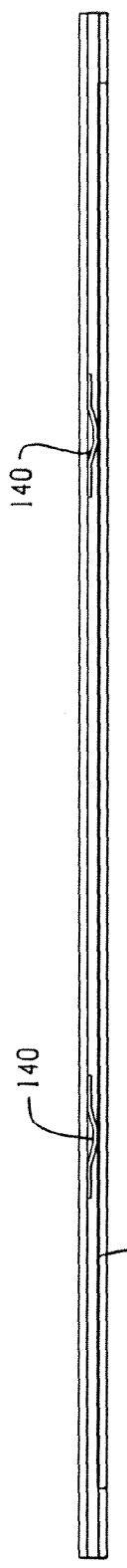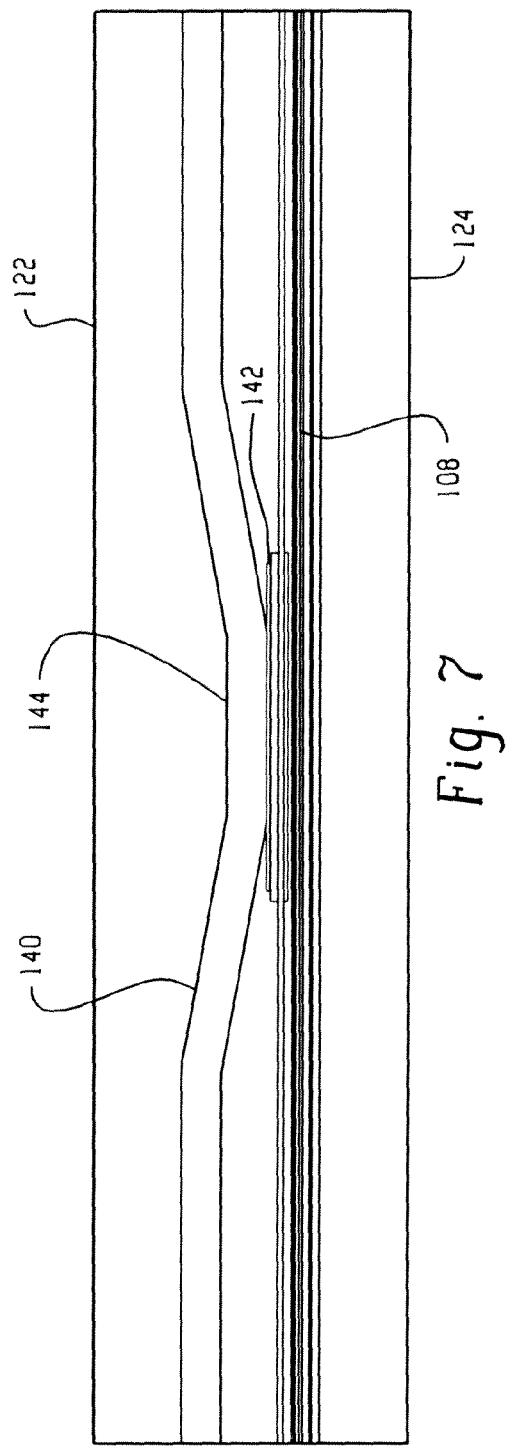
Fig. 5
Fig. 6
Fig. 7

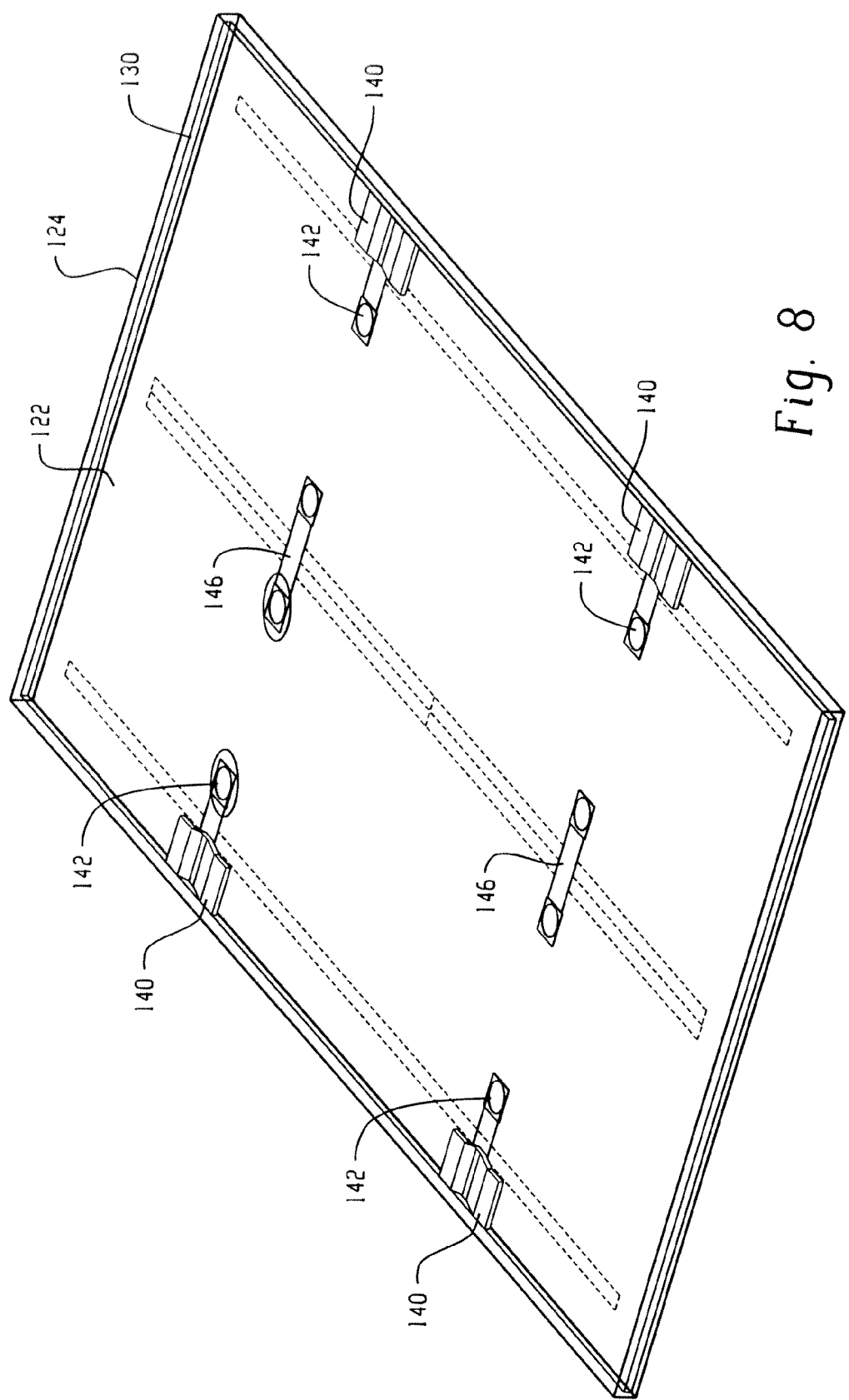

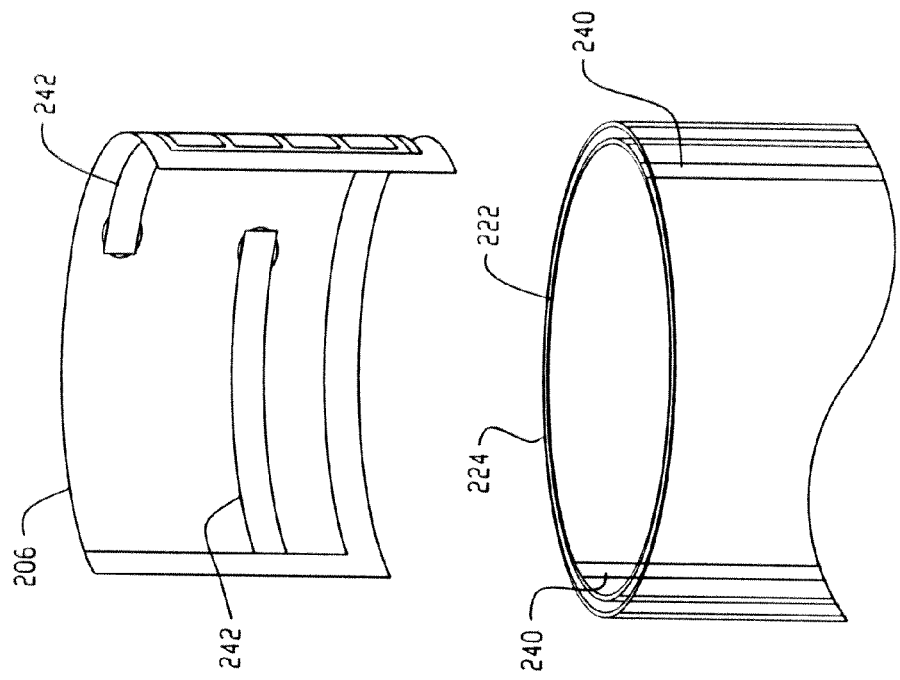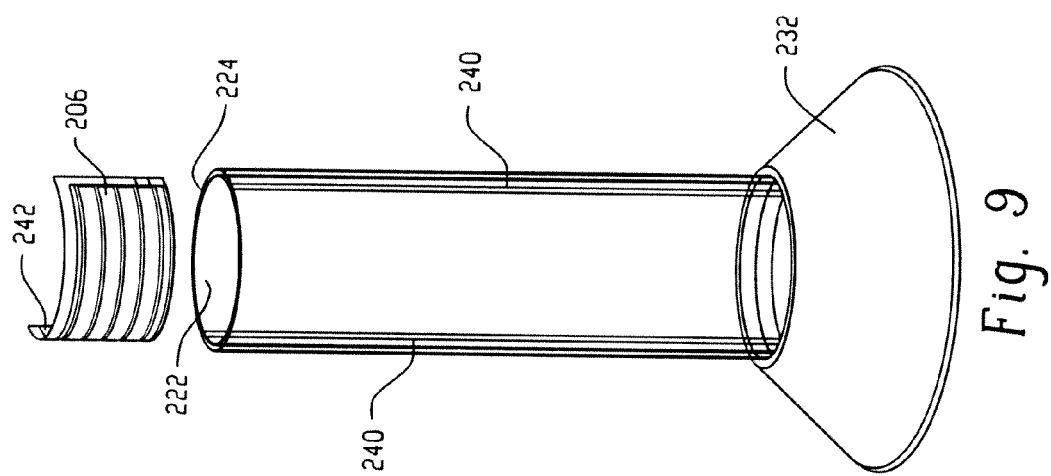

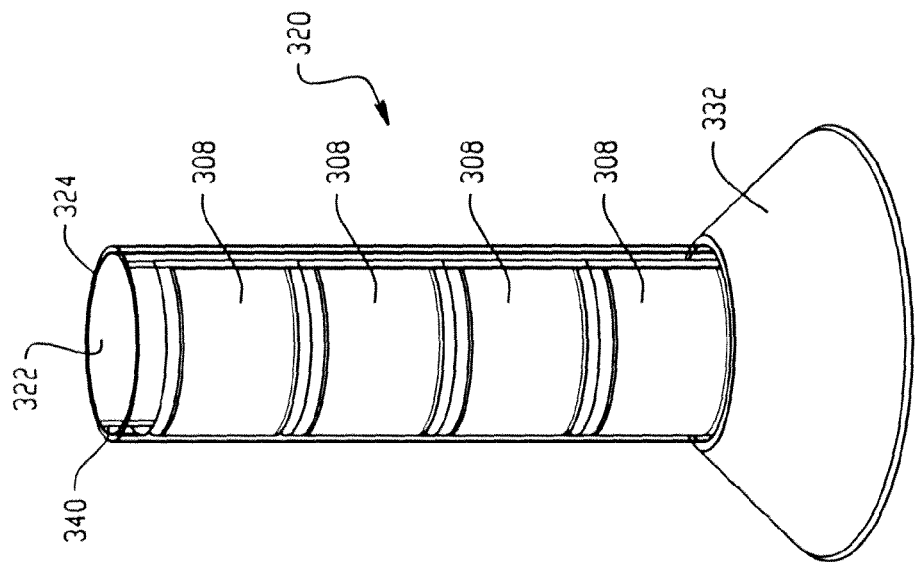
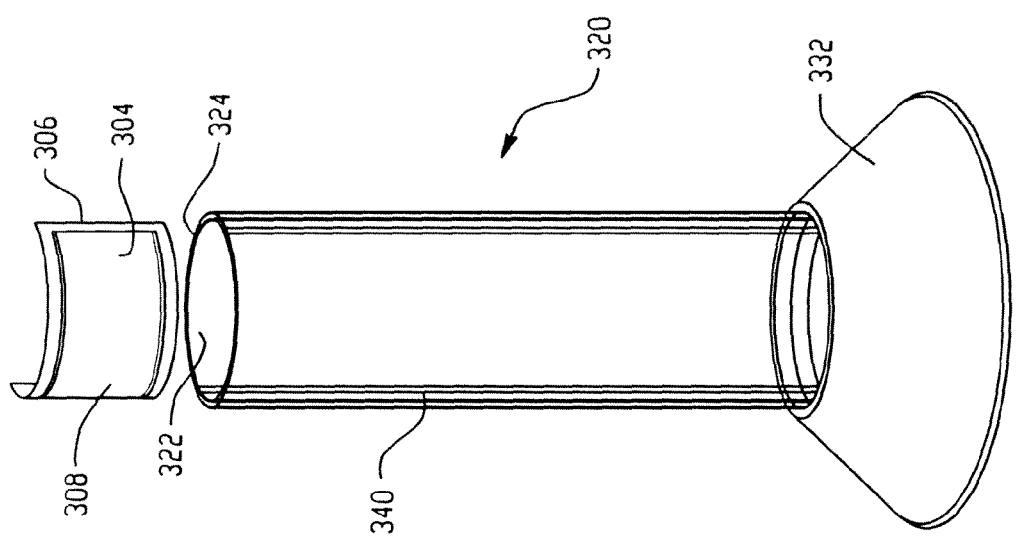

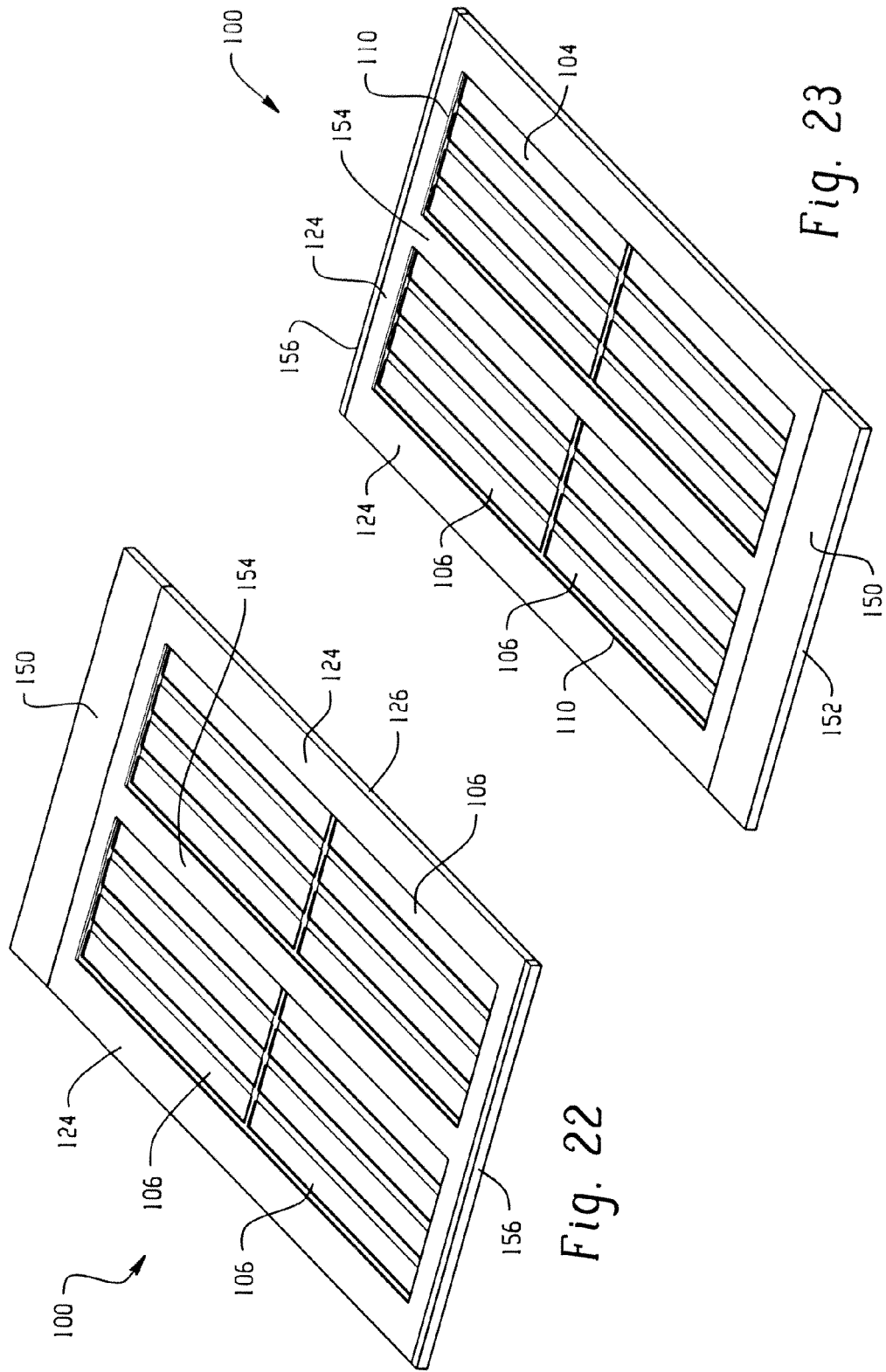

FIXTURE AND SOCKET ASSEMBLY FOR REPLACEABLE AND FLEXIBLE PANEL LIGHTING DEVICE

BACKGROUND OF THE DISCLOSURE

The present disclosure relates to a fixture and socket assembly, and particularly to a socket assembly configured to receive a replaceable and flexible panel lighting device such as an organic light emitting diode (OLED) panel, as well as an associated system for attaching an array of flexible lighting devices or panels.

OLED devices are generally known in the art. An OLED device typically includes one or more organic light emitting layer(s) disposed between electrodes. For example, a cathode, organic layer, and a light-transmissive anode formed on a substrate emit light when current is applied across the cathode and anode. As a result of the electric current, electrons are injected into the organic layer from the cathode and holes may be injected into the organic layer from the anode. The electrons and holes generally travel through the organic layer until they recombine at a luminescent center, typically an organic molecule or polymer. The recombination process results in the emission of a light photon, usually in the ultraviolet or visible range of the electromagnetic spectrum.

The layers of an OLED are typically arranged so that the organic layers are disposed between the cathode and anode layers. As photons of light are generated and emitted, the photons move through the organic layer. Those that move toward the cathode, which generally comprises a metal, may be reflected back into the organic layer. Those photons that move through the organic layer to the light-transmissive anode, and finally to the substrate, however, may be emitted from the OLED in the form of light energy. Some cathode materials may be light transmissive, and in some embodiments light may be emitted from the cathode layer, and therefore from the OLED device in a multi-directional manner. Thus, the OLED device has at least cathode, organic, and anode layers. Of course, additional, optional layers may or may not be included in the light source structure.

Cathodes generally comprise a material having a low work function such that a relatively small voltage causes the emission of electrons. Commonly used materials include metals such as gold, gallium, indium, manganese, calcium, tin, lead, aluminum, silver, magnesium, lithium, strontium, barium, zinc, zirconium, samarium, europium, and mixtures or alloys of any two or more thereof. On the other hand, the anode layer is generally comprised of a material having a high work function value, and these materials are known for use in the anode layer because they are generally light-transmissive. Suitable materials include, but are not limited to, transparent conductive oxides such as indium tin oxide (ITO), aluminum doped zinc oxide (AZO), fluorine doped tin oxide (FTO), indium doped zinc oxide, magnesium indium oxide, and nickel tungsten oxide; metals such as gold, aluminum, and nickel; conductive polymers such as poly(3,4-ethylenedioxythiophene) poly(styrenesulfonate) (PEDOT:PSS); and mixtures and combinations or alloys of any two or more thereof.

Preferably, these light emitting or OLED devices are generally flexible, i.e., are capable of being bent into a shape having a radius of curvature of less than about 10 centimeters. These light emitting devices are also preferably large-area which means they have a dimension of an area greater than or equal to about 10 centimeters squared, and in some instances are coupled together to form a generally flexible, generally planar OLED panel comprised of one or more OLED devices, which has a large surface area of light emission.

Preferably, the panel is hermetically sealed since moisture and oxygen have an adverse impact on the OLED device or panel. It is desired that an electrical pathway be established with the light emitting panel, and also that the electrical pathway maintain flexibility, be easily and accurately positioned, establish good electrical continuity, and maintain a thin profile. Commonly owned U.S. application Ser. No. 12/644,520 describes a light panel in which at least one electrical feed-through region is provided in the backsheet located inwardly from a periphery of the light source. A connector cable is positioned over the backsheet and has a portion of the connector cable extending outwardly of the light source periphery for connection with associated drive circuitry.

A need exists for a reliable fixture and socket system configured to receive one or more flexible OLED devices, panel, or array of panels, and a reliable manner of attaching the devices, panel, or panels to the fixture. Moreover, a need exists for a reliable fixture and socket system that allows for a wide array of sizes and shapes while still providing for reliable electrical contact, effective mechanical support, and the ability to avoid potential shorting with electrical connections.

SUMMARY OF THE DISCLOSURE

A fixture and socket assembly receives a flexible lighting device having a light emitting first surface and an opposed, rear surface. The assembly includes a rigid first surface configured to support at least a portion of the rear surface of the flexible lighting device. A rigid, second surface is spaced from the first surface by a dimension slightly greater than the thickness of the flexible lighting device and configured to receive the flexible lighting device between the first and second surfaces. At least one socket contact is provided adjacent a first edge of the first and second surfaces and dimensioned for electrical coupling with a conductive first portion of the flexible lighting device.

The first surface of the assembly is configured to support the rear surface of the flexible lighting device such that the lighting device substantially adopts the contour of the first surface therealong.

The assembly preferably includes multiple socket contacts located at spaced locations along a first edge of the first and second surfaces.

In one arrangement, multiple socket contacts are provided on opposite edges of the flexible lighting device.

The socket contact is configured to exert a biasing force on a conductive portion of the flexible lighting device.

The first surface of the assembly is substantially continuous in order to support substantially an entirety of the rear surface of the flexible lighting device.

In one arrangement, the second surface of the assembly forms a generally annular frame-like perimeter about the light emitting surface and the first and second surfaces are interconnected by a sidewall.

The sidewall preferably extends about three sides of the fixture and socket assembly, while a fourth side of the assembly includes an opening having a dimension slightly greater than a thickness of the flexible light panel.

In one arrangement, the first and second edges of the second surface are substantially coplanar, while in another embodiment, the first and second edges are not coplanar.

In another embodiment, the first surface is curved and adopts a portion of a substantially cylindrical conformation, and in a further embodiment the first and second surfaces are substantially co-cylindrical.

In yet another version, the first surface forms a substantially cylindrical shape, and the second surface forms a segment of a substantially cylindrical shape.

A primary advantage of the present disclosure is the ability to provide a press-fit electrical connection with the socket contact rather than directly welding to the contact surface.

Another advantage of the disclosure relates to the easy replacement of an OLED device or panel.

Still another advantage is the ability to accommodate a wide variety of conformations of the light source and fixture.

Still other benefits and advantages of the present disclosure will become apparent from reading and understanding the following detailed description.

BRIEF DESCRIPTION OF THE DRAWINGS

FIG. 2 is a perspective view of the frame and socket assembly with the light source removed.

FIG. 3 is a front view of the frame and socket assembly.

FIG. 4 is a cross-sectional view taken generally along the lines 4-4 of FIG. 2.

FIG. 5 is a front view similar to FIG. 3 with the light source received in the frame.

FIG. 6 is a cross-sectional view similar to FIG. 4 with the light source mounted therein.

FIG. 7 is an enlarged view showing one of the socket contacts in mechanical and electrical contact with a surface contact of the light source.

FIG. 8 is a perspective view of a rear surface of the fixture shown in transparent form to illustrate engagement between the socket contacts and surface contacts of the light source.

FIG. 9 is a perspective view of a fixture having a generally cylindrical receiving portion that receives a light source bent into a generally arcuate shape.

FIG. 10 is an enlarged rear view of the light source and an upper portion of the fixture of FIG. 9.

FIG. 19 is a perspective view similar to FIG. 9 showing a different type of light source.

FIG. 20 is a perspective view with multiple light sources inserted into the substantially cylindrical fixture.

FIG. 22 is a front perspective view of the fixture and socket assembly.

FIG. 23 is rear perspective of the fixture and socket assembly of FIG. 22.

DETAILED DESCRIPTION OF THE PREFERRED EMBODIMENTS

Figure 1:
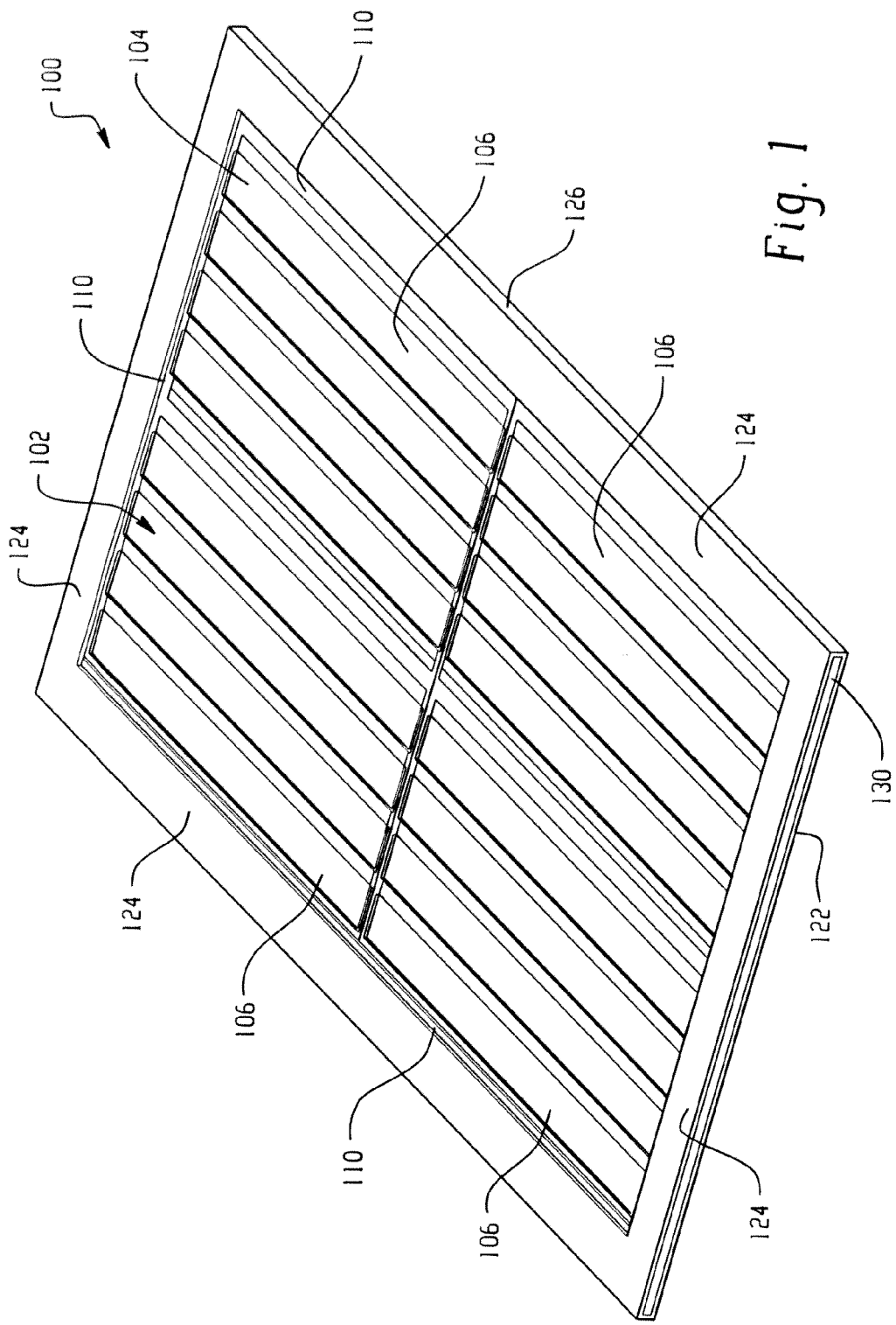
FIG. 1 is a perspective view of a fixture receiving lighting devices to form a light panel.
Figure 12:
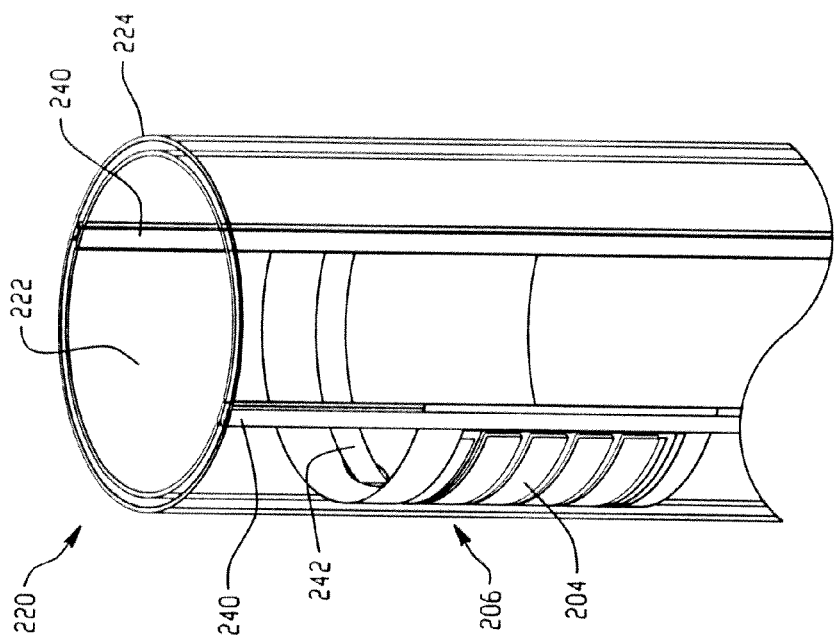
FIG. 12 is an enlarged perspective view from one side of FIG. 11.
Figure 11:
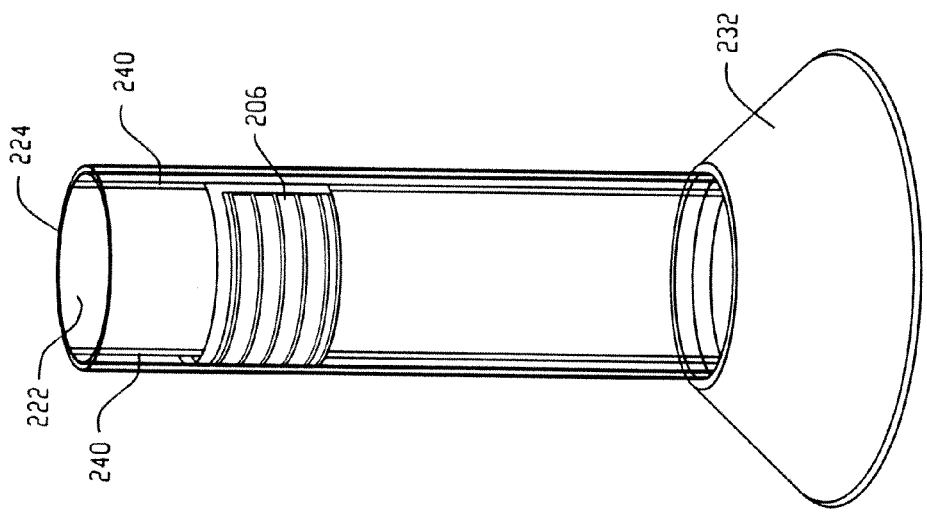
FIG. 11 is a perspective view showing partial insertion of the light source into the generally cylindrical fixture.
Figure 14:
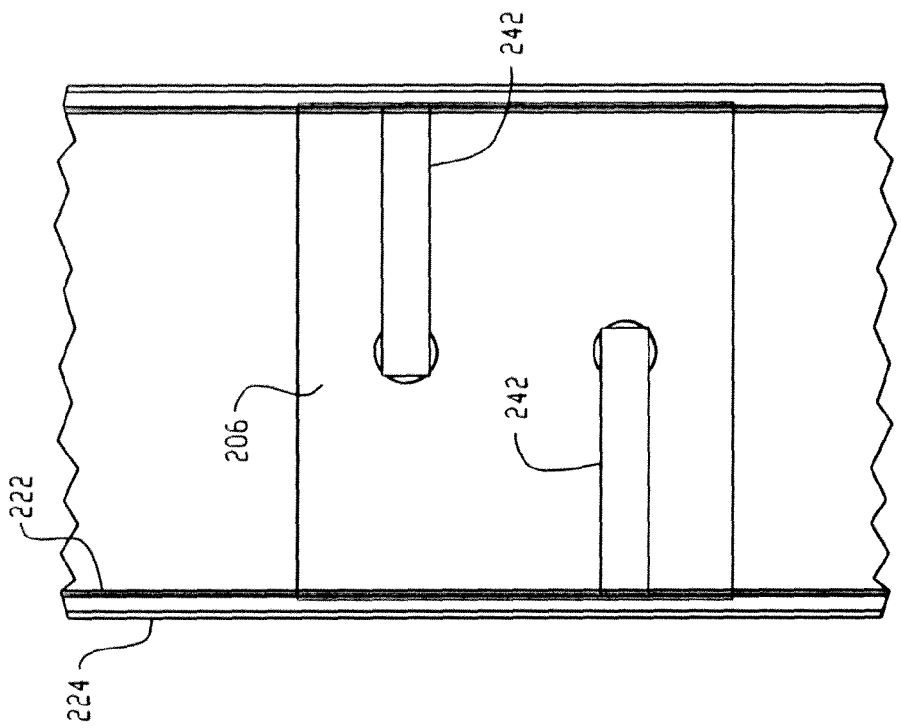
FIG. 14 is an elevational view taken from the rear of FIG. 11.
Figure 13:
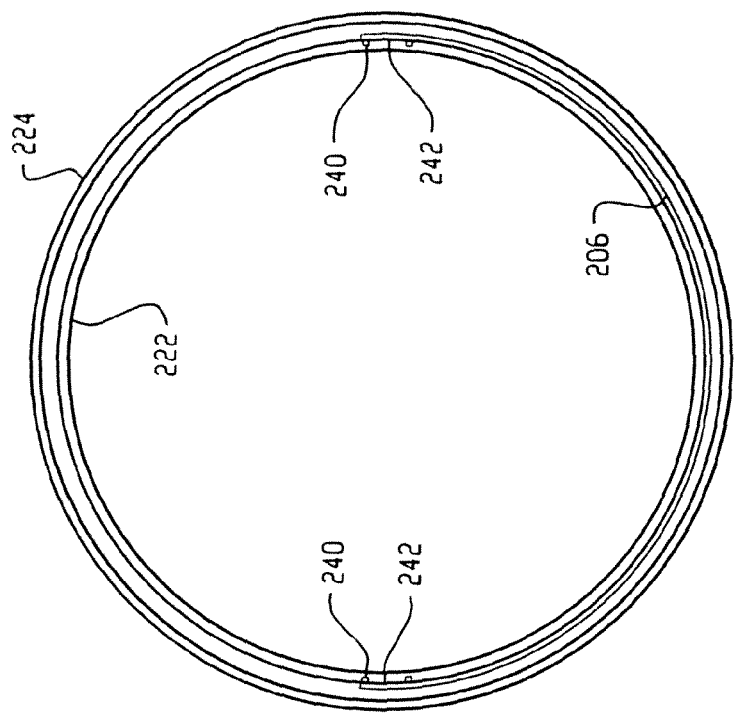
FIG. 13 is a top plan view of the fixture receiving the light source.

Shown in FIG. 1 is a flexible light source assembly 100 that includes a light source 102 formed at least in part by a generally planar, light emitting surface 104 which may be comprised of one or more flexible light sources or OLED devices 106 to form a matrix or panel 108. For example, as shown in FIG. 1, four individual flexible light source devices 106 are joined together to form a two-by-two (2×2) matrix or panel 108. Perimeter edges 110 of each light source device are either mechanically abutted against an adjacent flexible light source device perimeter edge, or received in a fixture 120 that receives the combined light sources or panel therein and supports the perimeter edges of contiguous light source devices that comprise the panel.

More particularly, the fixture 120 is additionally shown in FIGS. 2-4 with the light source components removed for ease of illustration. The fixture 120 includes a generally rigid, first surface 122 that is separated from a generally rigid, second surface 124 by a joining wall or sidewall 126. More particularly in the preferred embodiment of FIGS. 2-4, the first surface 122 has a solid, generally rectangular conformation that supports at least a portion of a rear surface of the light emitting devices or light panel, and preferably in this embodiment supports the entirety of the rear surface. The second surface 124, on the other hand, forms an open framework or generally annular structure having a central opening 128 that is dimensioned so that the light emitting surface 104 of the light panel assembly is situated relative to the central opening to direct light outwardly through the opening 128 and outer, perimeter edges of the light panel assembly are sandwiched between the first and second surfaces 122, 124. The spacing between the first and second surfaces 122, 124 is defined by the height dimension of the sidewall 126 and is slightly greater than a thickness of the individual light source devices or light panel (FIGS. 5-7). Moreover, the sidewall 126 preferably extends around three contiguous edges of the fixture but is not provided on at least a portion of one edge to provide an access opening 130 that receives the light source devices or panel. Thus, the perimeter edges of the light panel are supported by the first and second surfaces 122, 124 of the fixture and contained in place by the sidewall 126 along three sides. Moreover, a closure member (to be described further below) is subsequently received over the access opening once the panel is mounted in the fixture.

With continued reference to FIGS. 1-4, and additional reference to FIGS. 5-8, a series of electrical contacts or sockets (or socket contacts) 140 are provided in the fixture and preferably mounted to the first surface 122 of the panel at preselected locations that align with conductive portions or surface contacts 142 provided on the rear surface of the panel 108. More particularly, the surface contacts of the light emitting devices, light panel, or light source are located at predetermined locations and accessible from the rear surface of the lighting panel. The socket contacts 140 have a central bowed region 144 (FIG. 7) that provides some mechanical flexibility and the bowed region 144 acts like a spring that is urged into biasing mechanical engagement with the surface contact 142 and also establishes desired electrical contact between an individual surface contact 142 and an associated socket contact 140. For example, the 2×2 matrix shown in the exemplary embodiment has four socket contacts preferably located at perimeter locations of the panel (FIG. 8) that pinch against the rear edge seal of the panel, establish electrical connection with surface contacts 142, and hold the light panel against the frame to provide a secure retaining function that also provides an effective electrical connection. Socket contact size and shape can be modified to accommodate larger light panel matrices or may be located at other locations if desired. It will also be appreciated that further connections or contacts 146 (FIG. 8) are provided between adjacent individual flexible light source devices 106 to electrically connect one light source device with another so that power provided from the periphery of the panel is provided to the entire panel and to each of the individual light source devices.

Figure 15:
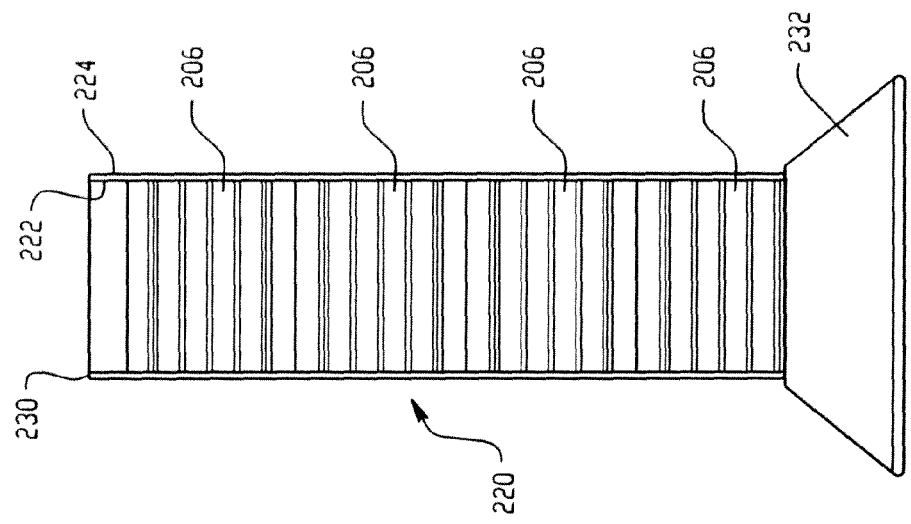
FIG. 15 shows the substantially cylindrical fixture with multiple light sources mounted therein.
Figure 16:
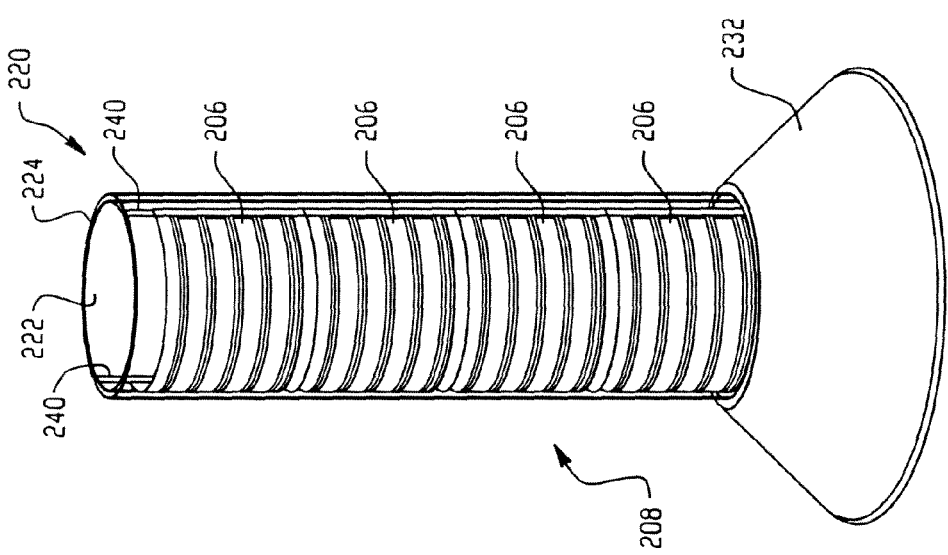
FIG. 16 is an elevational view of the assembly of FIG. 15.
Figure 18:
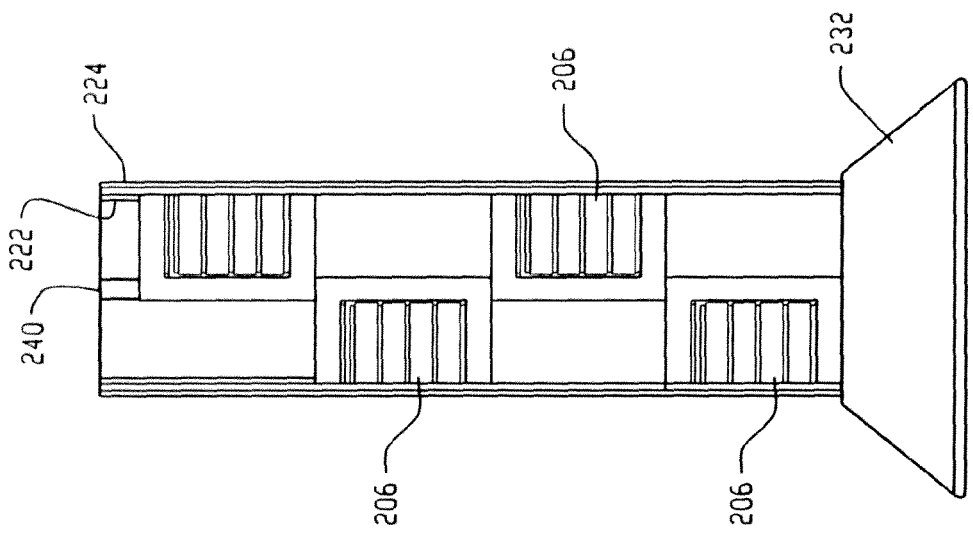
FIG. 18 is an elevational view of the assembly of FIG. 17.
Figure 17:
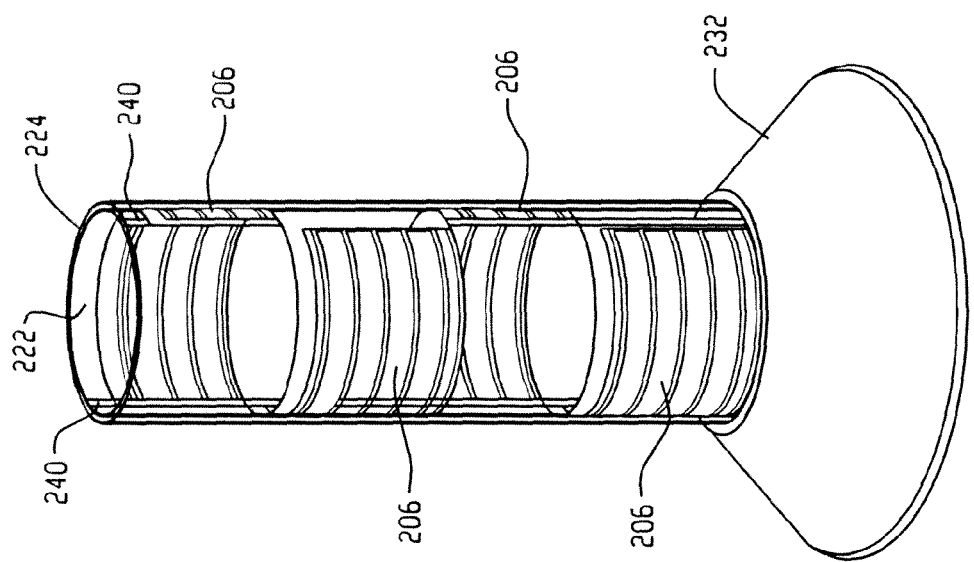
FIG. 17 is a perspective view of the fixture with front and rear facing light sources shown in alternating fashion.

As noted previously, each of the light source devices is flexible, i.e., relatively thin, and able to be bent into a shape having a radius of curvature of less than about 10 centimeters (10 cm). These flexible light emitting devices are also preferably large area which means these flexible light emitting devices have a dimension of an area greater than or about 10 centimeters squared (10 cm$^2$) and can be effectively coupled together to form the generally flexible, generally planar OLED panel 108 comprised of one or more individual devices 106 where the light source or panel has a large surface area 104 of light emission. Due to the flexible nature of the individual lighting devices and the panel, various fixture conformations can be formed to provide the desired mechanical support and the necessary electrical connection. For example, FIGS. 9-18 show one preferred embodiment that illustrates the flexible nature and types of conformations that are possible. An individual flexible light source device 206 is joined with similar flexible light source devices to provide a generally curvilinear, partially cylindrical light emitting surface as shown in FIGS. 15 and 16, or may be comprised of alternating forward and rearward directed arcuate light surfaces as shown in FIGS. 17 and 18. The fixture 220 has an inner, generally rigid, generally cylindrical first surface 222 that is coaxially received within an outer, generally rigid, generally cylindrical second surface 224. The generally cylindrical fixture surfaces 222, 224 are maintained in radially spaced, coaxial relation having an annular space therebetween. The fixture surfaces form an annular access opening 230 at one end of the fixture and are received in a support base 232 at the other end which closes the opening between the cylindrical first and second surfaces 222, 224 and maintains them in their upright, spaced conformation. In a similar manner, socket contacts 240 are provided along select regions of the first surface 222 and adapted for mechanical and electrical engagement with surface contacts 242 provided on the rear surface of the light source or individual flexible light source devices 206 (FIGS. 10, 11, 13, 14). As evident in FIG. 15, it will be appreciated that multiple individual light source devices 206 can be received in the fixture 220. Although four light devices are illustrated, the present disclosure should not be limited to this number, one skilled in the art understanding that a greater or lesser number of light source devices can be used as desired and without departing from the scope and intent of the present disclosure. Moreover, in this arrangement, the second surface 224 is preferably made of a light transmissive material since at least a portion of the second surface covers the light emitting surface 204 of the individual light source devices or panel.

The adaptability, conformability, and flexibility of the light source devices allow the light source devices to alternate in their directional output from the fixture as shown, for example, in FIGS. 17 and 18. Here, every other flexible light source device faces in a different or an opposite direction from the next adjacent flexible light source device, although this arrangement may also be altered if so desired. By way of example only, the directional output may not need to be 180 degrees opposite, or every other lighting device need not be differently oriented relative to an adjacent lighting device, or the color of different lighting devices may be selectively altered.

The embodiment of FIGS. 19 and 20 shows that a greater percentage of the surface 304 of each flexible light source device 306 emits light and therefore the total light output from the panel 308 received in the generally cylindrical fixture 320 is enhanced or increased. In substantially all other aspects like reference numerals in the 300 series refer to like components from the embodiment of FIGS. 9-18 so that assembly, and mechanical and electrical engagement provided on the socket contacts on the generally cylindrical first surface 322 can make mechanical and electrical engagement with surface contacts 342 provided on the rear surfaces of the individual flexible light source devices 306.

Figure 21:
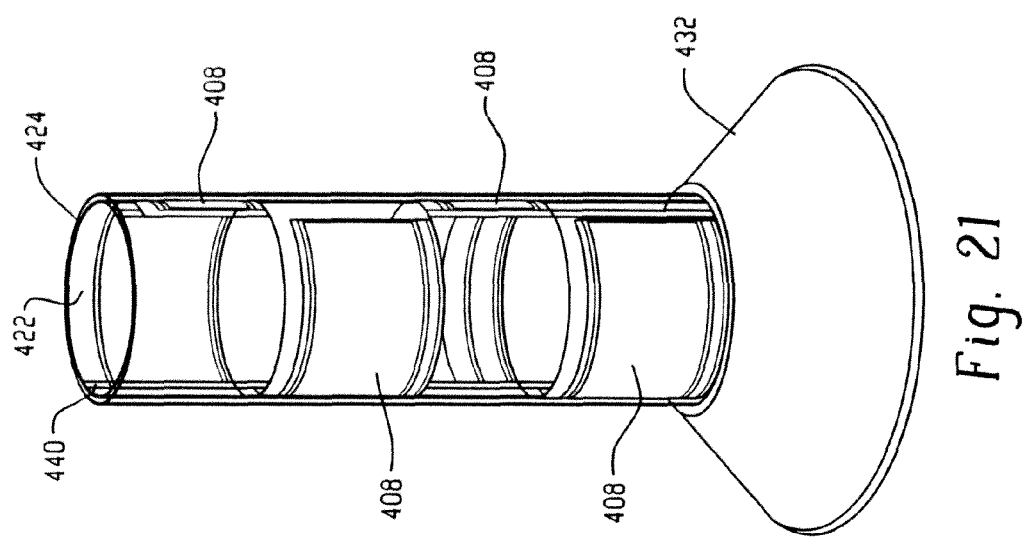
FIG. 21 is a perspective view with the light sources shown in alternating rearwardly and forwardly facing orientations.
Figure 25:
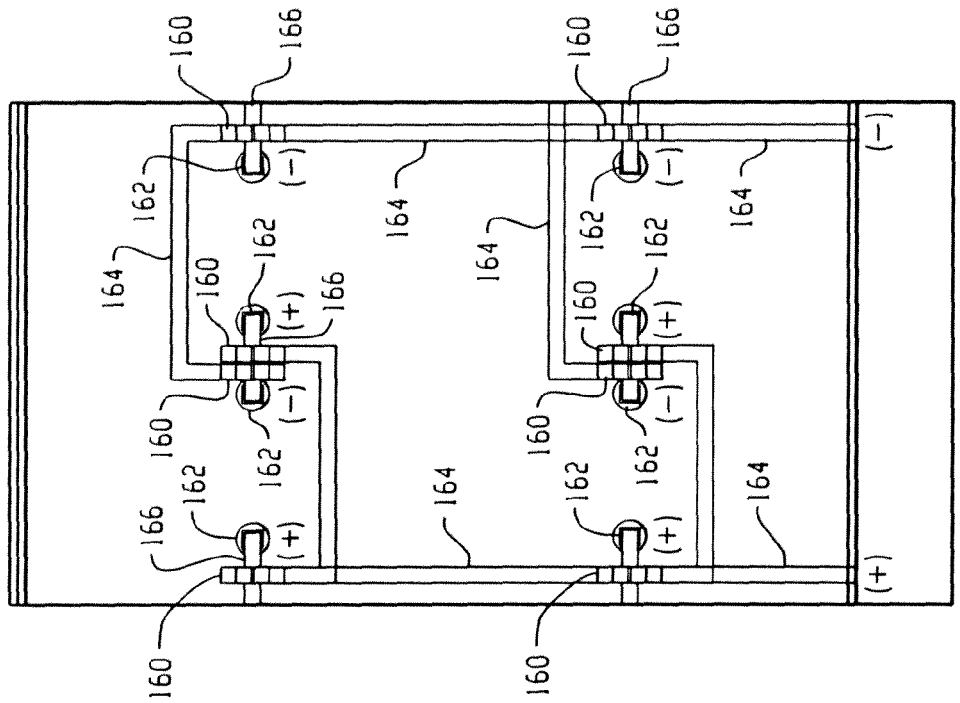
FIG. 25 is a rear plan view of a wiring, contact and socket contact arrangement in a preferred fixture.
Figure 24:
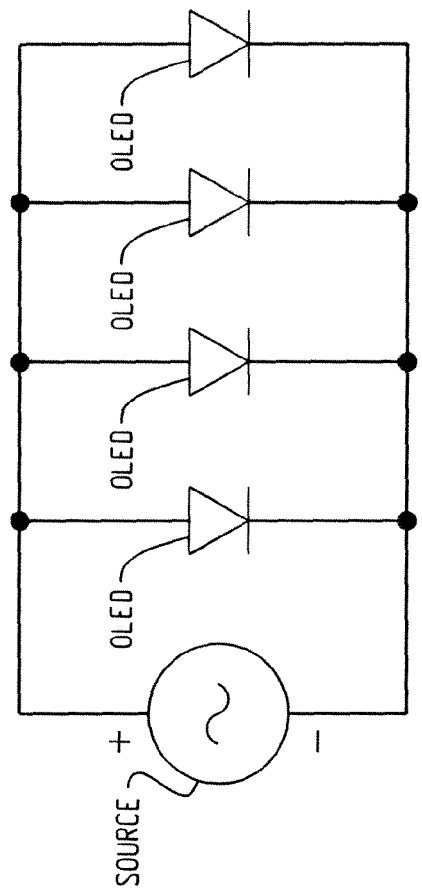
FIG. 24 is a schematic representation of the connections made with four light devices or OLEDs in the 2×2 matrix of, for example, FIGS. 22 and 23.

Likewise, FIG. 21 illustrates another embodiment that shares many similarities with the embodiment of FIGS. 17-18 so that reference numerals in the 400 series will refer to like components. The light emitting surfaces 404 of individual light source devices 406 having an increased light emitting surface area are faced in alternating or varied fashion within the generally cylindrical fixture 420. Again, in substantially all other respects including the use of socket contacts 440 provided on the first cylindrical surface 422 and the surface contacts 442 provided on rear surfaces of the individual light source devices 406 allows for ease of mechanical and electrical connection.

In FIGS. 22 and 23, an electronics supply circuitry may be included in box 150 that closes off the access opening 130 of the fixture. The box 150 provides a hard stop for the light emitting devices to slide into, and as shown in FIG. 22, the box also provides a suitable port 152 that provides for electrical connection with a suitable connector (not shown) to provide power to the circuit and light source. Additionally, a central bar 154 may be provided along a central perimeter abutment region between adjacent flexible light sources in the 2×2 matrix. The central support bar 154 may also be masked to incorporate an internal bus structure of the light emitting device and provide for added structural integrity to the fixture and socket assembly. In addition, an end cap 156 may be provided at an end of the fixture and socket assembly if sidewall 126 extends only along opposite sides of the fixture.

Figure 28:
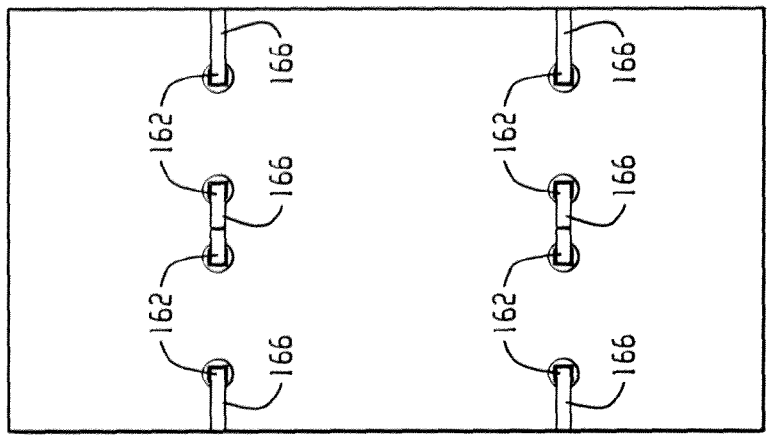
FIG. 28 is rear plan view similar to FIG. 27 showing a rear surface of the OLED device with leads.
Figure 27:
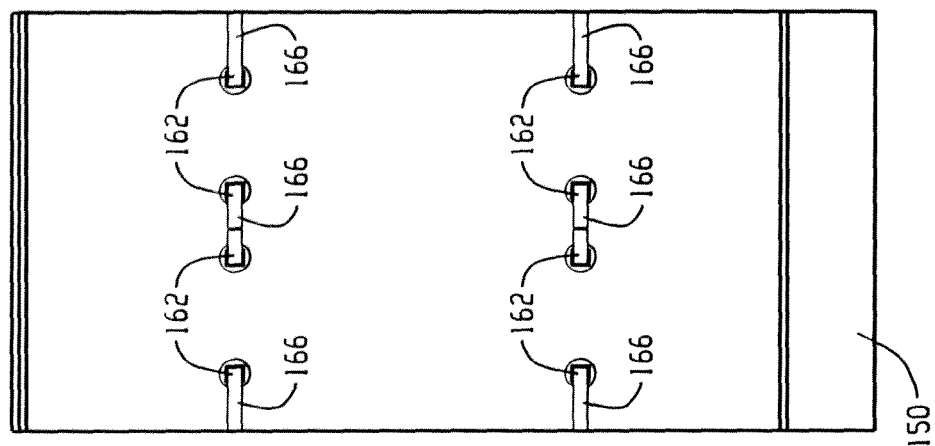
FIG. 27 is a rear plan view similar to FIG. 26 with the socket contacts removed.
Figure 26:
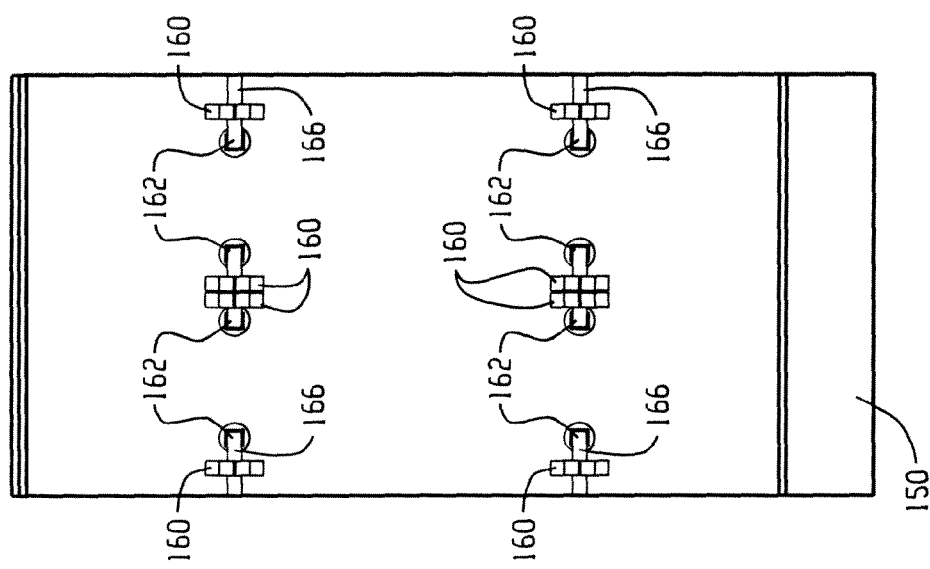
FIG. 26 is rear plan view similar to FIG. 25 with the socket wiring removed.
Figure 29:
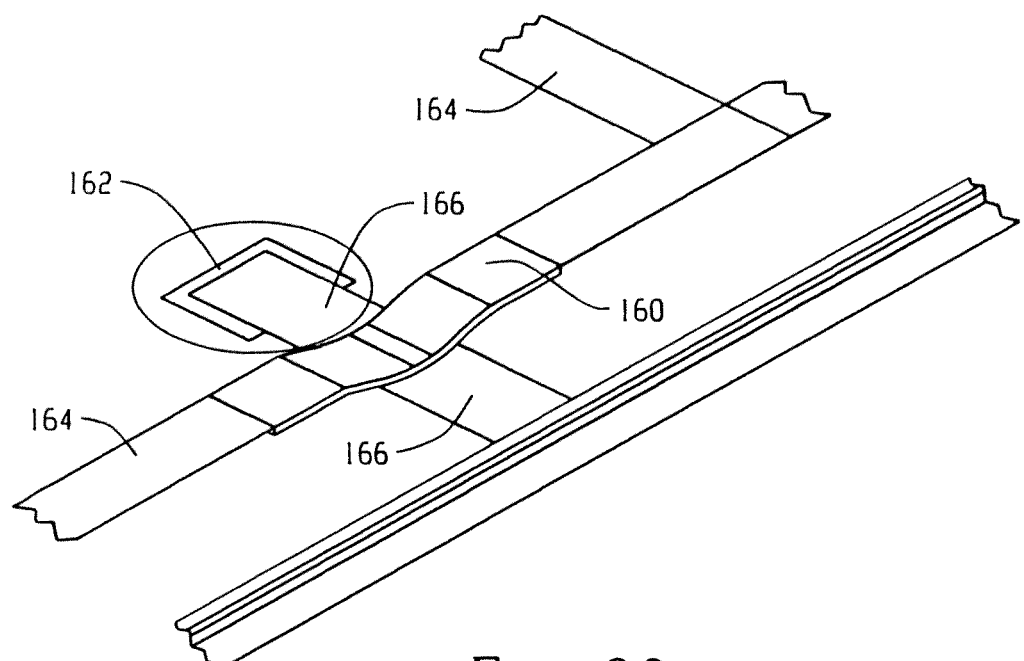
FIG. 29 is an enlarged perspective view of the wiring, lead, and socket assembly.
Figure 30:
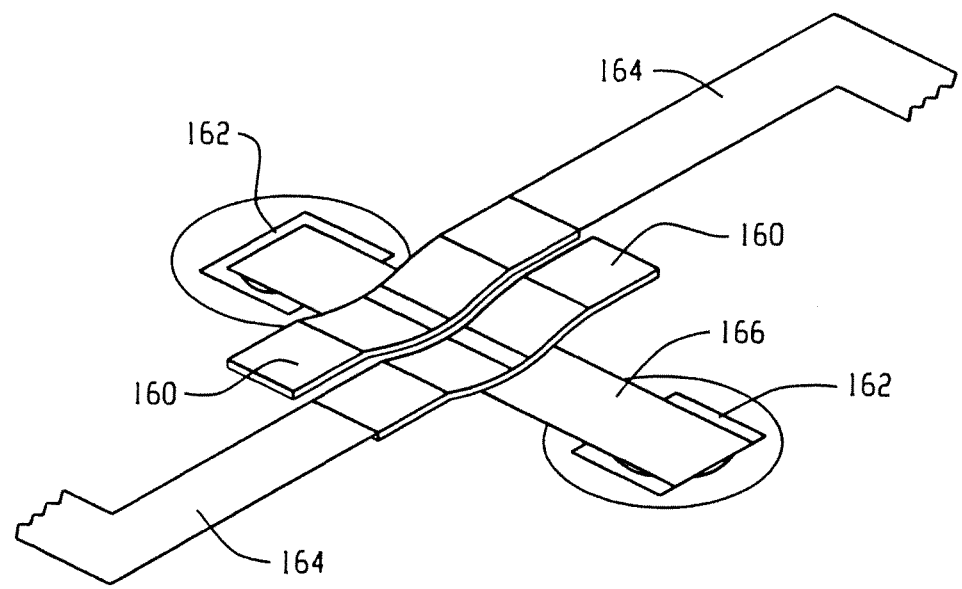
FIG. 30 is an enlarged perspective view of the electrical and mechanical engagement.

Additionally shown in FIGS. 24-28 are a schematic circuit and various layers of the fixture and socket assembly 100. For example, the assembly is shown with a transparent body for ease of illustration where eight (8) contacts 160 and associated surface contacts 162 are wired as represented by reference numeral 164 into a desired electrical configuration and associated leads 166 on the light emitting devices interface with the socket contacts 160. As shown in FIG. 26, the socket wiring has been removed, while in FIG. 27 the socket contacts are removed for ease of illustration. FIG. 28 further shows the light emitting device bottom side with leads 162 so that two contacts of a socket are wired to interface with two leads on the light emitting device. The light emitting device comes pre-wired for the desired electrical configuration. Although these illustrations show a two-by-two (2×2) matrix in a socket with parallel contacts, the disclosure could be for any size OLED or other flexible light emitting device in series, parallel, or series-parallel configuration. Further enlarged views of the socket contacts 160, surface contacts 162, wiring 164 and leads 166 are shown in FIGS. 29 and 30.

Figure 31:
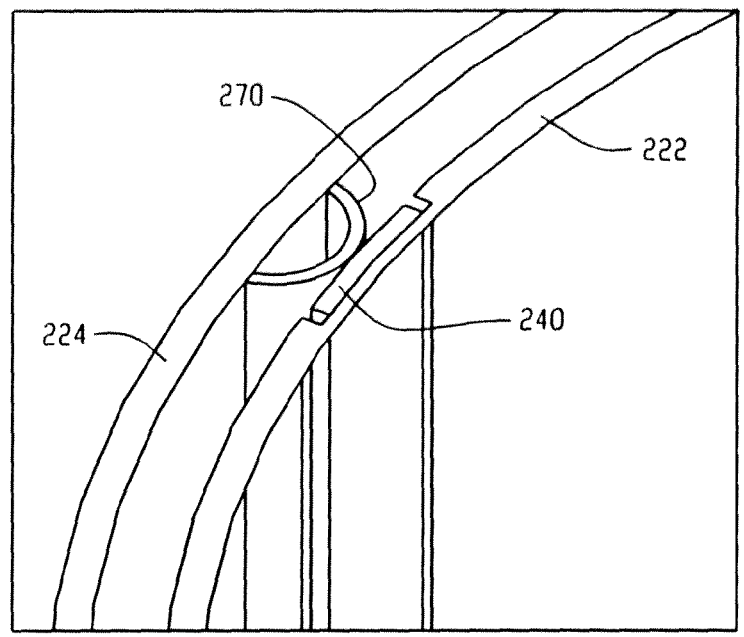
FIG. 31 is an isometric view of a biasing arrangement to facilitate contact.
Figure 32:
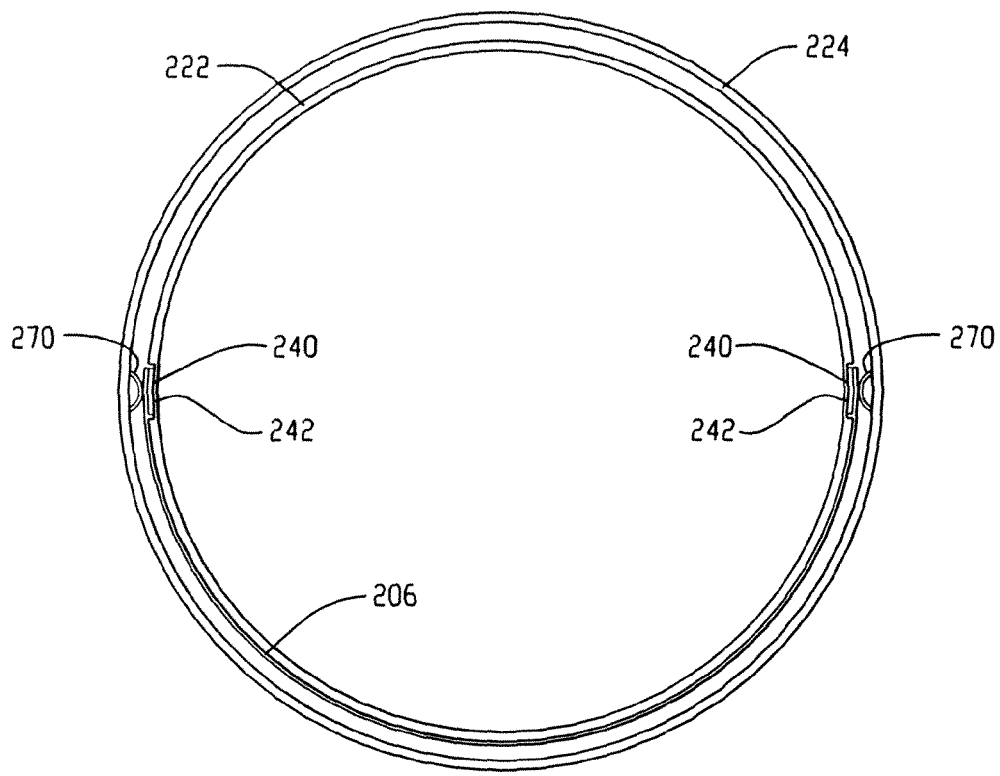
FIG. 32 is a top plan view of the fixture and socket assembly of FIG. 31.

FIGS. 31 and 32 are enlarged views that illustrate the inclusion of a biasing member or spring 270 that extends inwardly from the generally cylindrical, second surface 224 to provide desired pressure on the flexible light emitting device 206 so that the surface contacts 242 on the rear surface of the individual OLED devices make the desired mechanical and electrical connection with the associated socket contacts 240 provided on the generally cylindrical, first surface 222. In this arrangement, the biasing members 270 have a generally arcuate cross-section, and have sufficient resiliency to provide a spring-like function, although other conformations of the biasing members can be used without departing from the scope and intent of the present disclosure.

Figure 35:
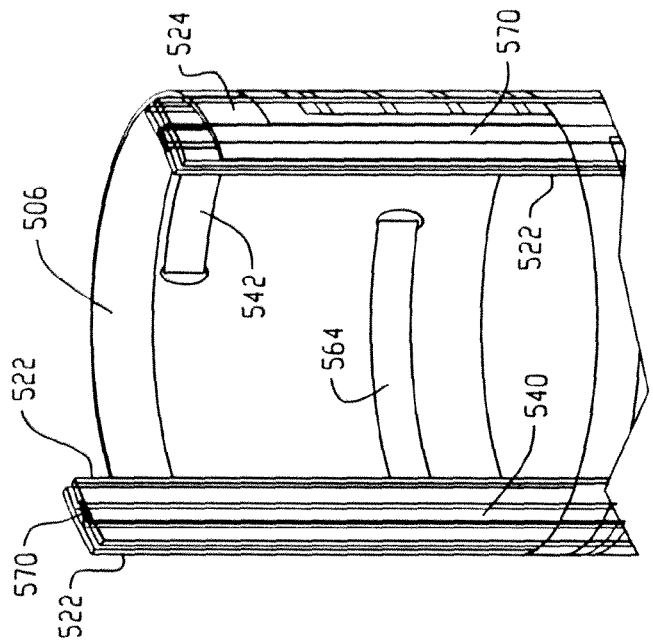
FIG. 35 is an enlarged view of portions of the fixture and socket assembly of FIG. 33.
Figure 34:
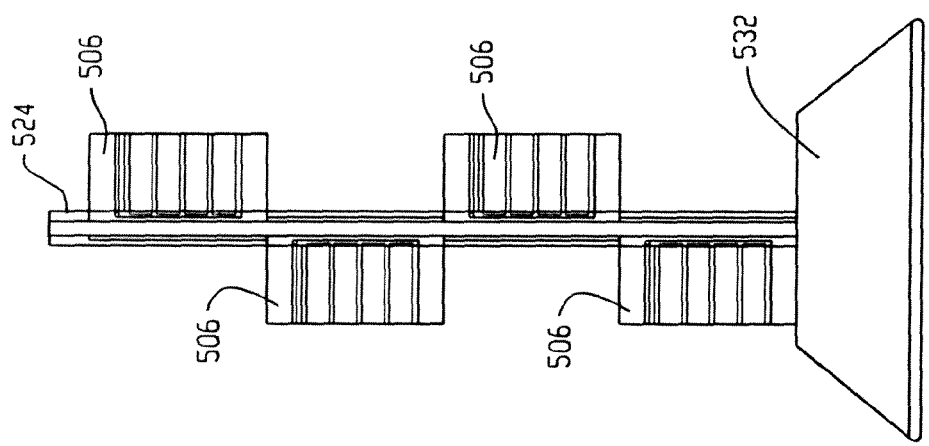
FIG. 34 is an elevational view of the fixture and socket assembly of FIG. 33.
Figure 33:
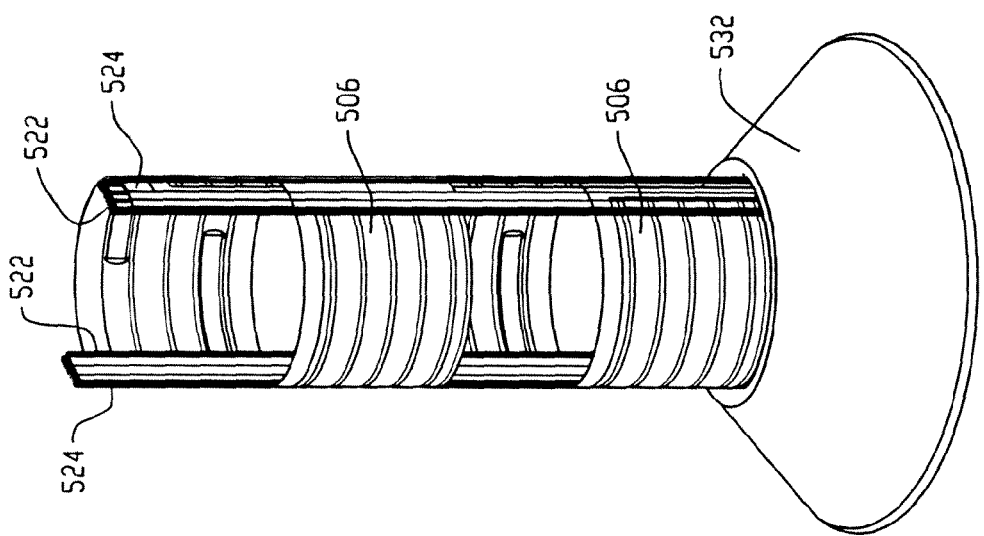
FIG. 33 is an isometric view of another embodiment of the fixture and socket assembly.

FIG. 33-35 illustrate that the first and second surfaces 522, 524 that support the flexible light source devices 506 may be formed as spaced posts that receive opposite edges of individual flexible light source devices. Again, the light source devices can all be arranged to face in the same direction or may be disposed in different directions such as alternating forward and rearward directions as shown in FIGS. 33-35. The orientation of the support posts can be vertical, horizontal, spiral, arched, bent, and still other orientations since the light emitting device is flexible.

Figure 37:
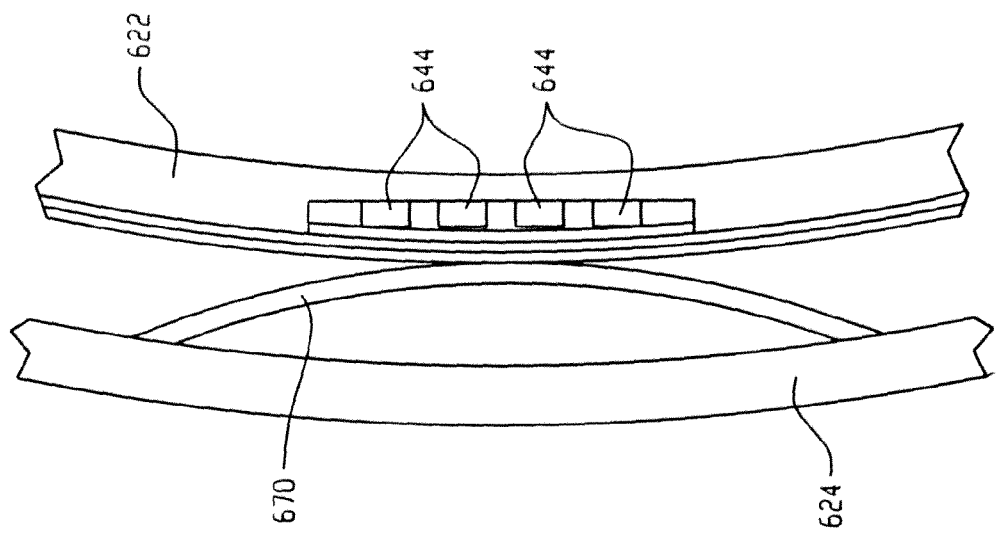
FIG. 37 is a top plan view of the modified socket contact of FIG. 36.
Figure 36:
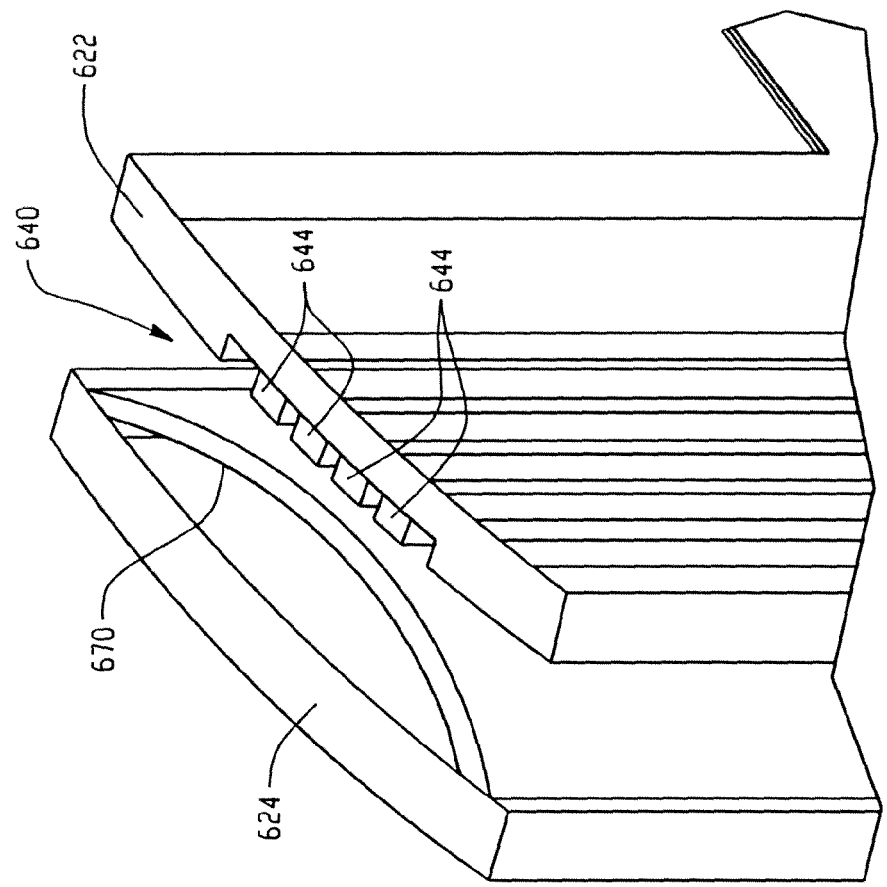
FIG. 36 is an enlarged isometric view of a modified socket contact.

FIGS. 36 and 37 illustrate that the socket contacts 640 provided on the posts could be split into individual electrical surfaces 644 so that individual control settings on a select pair of contacts, governed by the electronics hidden in the base, would provide greater design flexibility. Selected other contacts or sockets could be locally masked or the light emitting device lead could be masked to prevent shorting across the multiple contacts.

The fixture can be formed from a metal, polymer, or other suitable generally rigid material. If formed from metal, a preferred metal is aluminum, or an aluminum/tin alloy. If the metal is used for the fixture, the surface is preferably coated with oxidized material or coated with a polymer to avoid shorting of the interconnects. Likewise, it is understood that composite materials could be used or a polymer/metal combined mixed material could be used. For example, the melting point less than 300° C. is used in one polymer that is an ethylene/tetrafluoroethylene copolymer. A silicon-coated woven glass fiber scrim and a polyvinyl fluoride could be used, or a polyethyleneteraphthalal and ethylene-tetrafluoroethylene copolymer. Alternatively, a polyethylene or medium density polyethylene, or a high density polyethylene may be used. Preferably, the fixture is adapted to withstand electrical loading between 0 and 50 watts, and the color parameters may range from 3000K to 6500K.

The disclosure has been described with respect to preferred embodiments. Obviously, modifications and alterations may be contemplated by one skilled in the art, and the subject disclosure should not be limited to the particular examples described above but instead through the following claims.

What is claimed is:

1. A fixture and socket assembly for receiving a flexible light panel having a light emitting first surface and an opposed, rear surface, the assembly comprising:
 a rigid, first surface configured to support at least a portion of the rear surface of the flexible light panel;
 a rigid, second surface spaced from the first surface by a dimension slightly greater than a thickness of the flexible light panel and configured to receive at least a portion of the flexible light panel between the first and second surfaces; and
 at least one socket contact provided adjacent a first edge of the first and second surfaces dimensioned for electrical coupling with a conductive portion of the flexible light panel and configured to exert a biasing force on the conductive portion of the flexible light panel.

2. The assembly of claim 1 wherein the first surface is configured to support the rear surface of the flexible light panel such that the flexible light panel substantially adopts the contour of the first surface.

3. The assembly of claim 1 wherein the socket contact includes multiple socket contacts located at spaced locations along the first edge of the first and second surfaces.

4. The assembly of claim 3 wherein the multiple socket contacts include socket contacts on opposite edges of the flexible light panel.

5. The assembly of claim 1 wherein the first surface is substantially continuous for supporting the rear surface of the flexible light panel.

6. The assembly of claim 5 wherein the second surface extends inwardly a limited dimension from a perimeter whereby the light emitting surface of the flexible light panel is unobstructed.

7. A fixture and socket assembly for receiving a flexible light panel having a light emitting first surface and an opposed, rear surface, the assembly comprising:
 a rigid, first surface configured to support the rear surface of the flexible light panel;
 a rigid, second surface spaced from the first surface by a dimension slightly greater than a thickness of the flexible light panel and configured to receive the flexible light panel between the first and second surfaces, wherein the second surface forms a generally annular frame-like perimeter about the light emitting surface, and the first and second surfaces are interconnected by a sidewall; and
 at least one socket contact provided adjacent a first edge of the first and second surfaces dimensioned for electrical coupling with a conductive portion of the flexible light panel.

8. The assembly of claim 7 wherein the sidewall extends about three sides of the assembly.

9. The assembly of claim 8 wherein a fourth side of the assembly includes an opening having a dimension slightly greater than a thickness of the flexible light panel.

10. The assembly of claim 1 wherein the second surface extends along first and second opposite edges of the flexible light panel.

11. The assembly of claim 10 wherein the first and second edges of the second surface are substantially co-planar.

12. A fixture and socket assembly for receiving a flexible light panel having a light emitting first surface and an opposed, rear surface, the assembly comprising:
- a rigid, first surface configured to support the rear surface of the flexible light panel;
- a rigid, second surface spaced from the first surface by a dimension slightly greater than a thickness of the flexible light panel and configured to receive the flexible light panel between the first and second surfaces, wherein the second surface extends along first and second opposite edges of the flexible light panel and the first and second edges of the second surface are not coplanar; and
- at least one socket contact provided adjacent a first edge of the first and second surfaces dimensioned for electrical coupling with a conductive portion of the flexible light panel.

13. The assembly of claim 12 wherein the first surface is curved along a substantially cylindrical extent.

14. The assembly of claim 12 wherein the first and second surfaces are substantially parallel to one another.

15. The assembly of claim 14 wherein the first and second surfaces are substantially co-cylindrical.

16. The assembly of claim 15 wherein the conductive portion extends continuously along a substantially linear extent.

17. The assembly of claim 16 further comprising a second conductive portion spaced from the conductive portion.

18. The assembly of claim 14 wherein the first surface forms a substantially cylindrical shape and the second surface forms a segment of a substantially cylindrical shape.

19. The assembly of claim 18 wherein the second surface terminates along opposite edges of the light emitting surface of the flexible light panel.

20. The assembly of claim 12 wherein the socket contact is configured to exert a biasing force on the conductive portion of the flexible light panel.

* * * * *